United States Patent
Song et al.

(10) Patent No.: US 10,439,164 B2
(45) Date of Patent: Oct. 8, 2019

(54) COVER WINDOW AND DISPLAY DEVICE INCLUDING THE SAME

(71) Applicant: LG Display Co., Ltd., Seoul (KR)

(72) Inventors: Kelly Soo-Yeun Song, Paju-si (KR); Mi-Hyung Chin, Paju-si (KR); Jun-Ha Hwang, Paju-si (KR); Jae-Yeong Kim, Paju-si (KR); Won-Bong Jang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/113,971

(22) Filed: Aug. 27, 2018

(65) Prior Publication Data

US 2019/0067633 A1    Feb. 28, 2019

(30) Foreign Application Priority Data

Aug. 29, 2017 (KR) .......................... 10-2017-0109702

(51) Int. Cl.
| | |
|---|---|
| *H01L 51/52* | (2006.01) |
| *G02F 1/1333* | (2006.01) |
| *G02F 1/1368* | (2006.01) |
| *G02F 1/1362* | (2006.01) |
| *H01L 27/32* | (2006.01) |
| *H01L 51/00* | (2006.01) |

(52) U.S. Cl.
CPC .... *H01L 51/5246* (2013.01); *G02F 1/133308* (2013.01); *H01L 51/5237* (2013.01); *G02F 1/1368* (2013.01); *G02F 1/136209* (2013.01); *G02F 1/136213* (2013.01); *G02F 2001/133331* (2013.01); *G02F 2201/121* (2013.01); *G02F 2202/103* (2013.01); *H01L 27/3244* (2013.01); *H01L 51/0097* (2013.01); *H01L 2251/5315* (2013.01); *H01L 2251/5338* (2013.01)

(58) Field of Classification Search
CPC .......... H01L 51/5246; G02F 1/133308; G02F 2001/133331; G02F 2202/28; B32B 27/08
See application file for complete search history.

(56) References Cited

U.S. PATENT DOCUMENTS

| | | | |
|---|---|---|---|
| 2015/0144921 A1* | 5/2015 | Lim | .................... H01L 51/0097 257/40 |
| 2015/0261033 A1* | 9/2015 | Shin | .................... H05K 5/0086 349/58 |

\* cited by examiner

*Primary Examiner* — James Wu
*Assistant Examiner* — Hung Q Dang
(74) *Attorney, Agent, or Firm* — Fenwick & West LLP

(57) ABSTRACT

A display device comprises a cover window including a first area of a curved shape and a second area of a flat shape and having a first end connected to the first area, wherein the first area has a plurality of first concave patterns at its inner surface; a display panel under the cover window; and an adhesive layer between the cover window and the display panel.

21 Claims, 7 Drawing Sheets

COVER WINDOW AND DISPLAY DEVICE INCLUDING THE SAME

CROSS-REFERENCE TO RELATED APPLICATION

The present application claims priority from and the benefit under 35 U.S.C § 119(a) of Republic of Korea Patent Application No. 10-2017-0109702 filed on Aug. 29, 2017, which is hereby incorporated by reference in its entirety.

BACKGROUND OF THE INVENTION

Field of the Disclosure

The present invention relates to a display device, and more particularly, to a cover window having a curved shape and a display device including the same.

Discussion of the Related Art

With rapid development of information technologies, display devices for displaying a large amount of information have been promptly developed. Recently, flat panel display (FPD) devices having a thin profile, light weight and low power consumption, such as liquid crystal display devices or electroluminescent display devices, have been suggested and widely used. Among the flat panel display devices, liquid crystal display devices comprise a liquid crystal panel with an upper substrate, a lower substrate and a liquid crystal layer interposed therebetween. Liquid crystal molecules of the liquid crystal layer are driven by an electric field generated between a pixel electrode and a common electrode, and thus an image is displayed. The electroluminescent display devices comprise a light emitting diode which includes an anode and a cathode with a light emitting layer interposed therebetween. Holes and electrons respectively injected from the anode and the cathode are combined in the light emitting layer to thereby emit light, and thus an image is displayed.

These flat panel display devices are widely used for portable devices such as smartphones, computer monitors, or televisions. Recently, the flat panel display devices have been used in various shapes while being bent or folded. Among these shapes, a structure in which ends of the flat panel display device have a curved shape has been proposed and developed. Such a display device having a curved end is manufactured by attaching a flat display panel to a curved cover window using an adhesive layer.

However, the curved cover window is formed by bending the ends of a flat cover window through processing, and a force to be returned in a flat shape acts on the curved cover window. Accordingly, stress is generated at the interface between the cover window and the adhesive layer to cause delamination, and bubbles occur between the cover window and the adhesive layer. The bubbles appear as spots on the display device and lowers the display quality.

SUMMARY OF THE INVENTION

Embodiments relate to a cover window of a display device. The cover window has a first area of a curved shape, and a second area of a flat shape and having a first end connected to the first area. The first area has a plurality of first concave patterns at an inner surface of the first area on which adhesive is applied for attaching to a display panel.

In some embodiments, at least one side of each of the first concave patterns is inclined at a first angle with respect to the inner surface of the first area facing the display panel.

In some embodiments, a width of each first concave pattern is the same as or larger than a spacing between adjacent ones of the first concave patterns.

In some embodiments, the inner surface of the first area includes a curved portion and a flat portion, and the plurality of first concave patterns at the curved portion are of a higher density than the plurality of first concave patterns at the flat portion.

In some embodiments, the second area has a plurality of second concave patterns at an inner surface of the second area facing the display panel.

In some embodiments, at least one side of each of the second concave patterns has a second angle with respect to the inner surface of the second area, and the second angle is larger than the first angle.

In some embodiments, the cover window further includes a third area connected to a second end of the second area. The third area has a plurality of third concave patterns at an inner surface of the third area facing the display panel.

In some embodiments, the first concave patterns and the third concave patterns are symmetrical with respect to the second area.

Embodiments also relate to a display device including a cover window, a display panel and an adhesive layer. The cover window includes a first area of a curved shape and a second area of a flat shape and having a first end connected to the first area, wherein the first area has a plurality of first concave patterns at an inner surface of the first area. The display panel is placed under the cover window and the inner surface of the first area faces the display panel. The adhesive layer is between the cover window and the display panel.

Embodiments also relate to a cover window including an outer surface and an inner surface at an opposite side of the outer surface. At least part of the inner surface is curved to match a shape of an outer surface of a display panel. The inner surface is patterned with a plurality of concaved portions. At least a subset of which has slanted side surfaces to interlock with adhesive placed on the inner surface for attaching the cover window to a display panel.

In some embodiments, a width of each of the concaved portions is same as or larger than spacing between an adjacent concaved portion.

In some embodiments, the width of each of the concaved portions is 30 to 50 micrometers and a depth of each of the concaved portions is 30 to 50 micrometers.

In some embodiments, side surfaces of two adjacent ones of the concaved portions define space having a cross section of a rectangular shape.

In some embodiments, side surfaces of two adjacent ones of the concaved portions define space having a cross section of a triangular shape.

In some embodiments, a curved portion of the inner surface has a higher density of the concaved portions relative to a flat portion of the inner surface.

BRIEF DESCRIPTION OF THE DRAWINGS

The accompanying drawings, which are included to provide a further understanding of the present disclosure and which are incorporated in and constitute a part of this specification, illustrate an embodiment of the present disclosure and together with the description serve to explain the principles of the present disclosure. In the drawings.

DETAILED DESCRIPTION OF THE EMBODIMENT

Reference will now be made in detail to an exemplary embodiment of the disclosure, examples of which are illustrated in the accompanying drawings.

Figure 1:
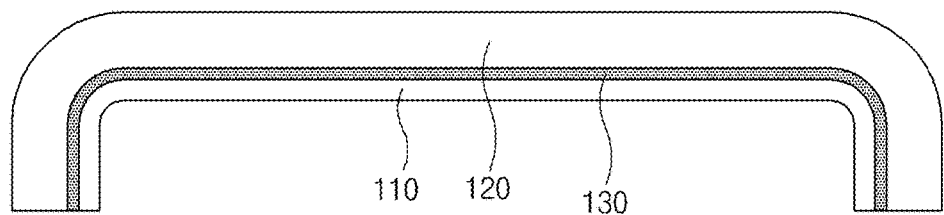
FIG. 1 is a cross-sectional view schematically showing a display device according to an embodiment of the present disclosure.
Figure 2A:
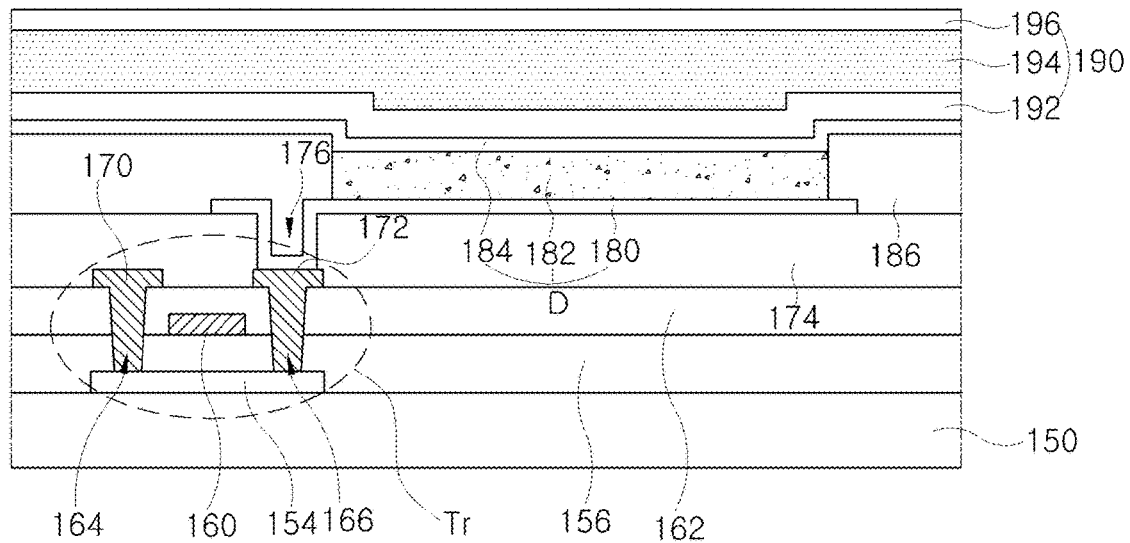
FIGS. 2A and 2B are cross-sectional views schematically showing examples of a display panel for the display device according to the embodiment of the present disclosure.
Figure 2B:
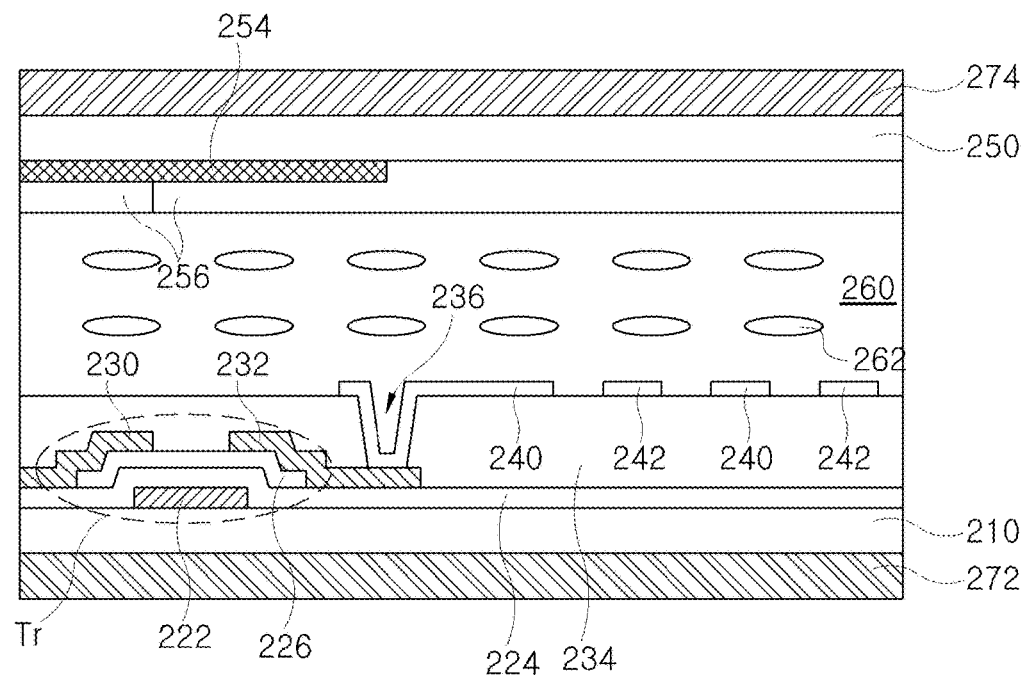

FIG. 1 is a cross-sectional view schematically showing a display device according to an embodiment of the present disclosure. FIGS. 2A and 2B are cross-sectional views schematically showing examples of a display panel for the display device according to the embodiment of the present disclosure and show a pixel region.

In FIG. 1, the display device according to the embodiment of the present disclosure includes a display panel 110, a cover window 120 over the display panel 110, and an adhesive layer 130 between the display panel 110 and the cover window 120.

The display panel 110 includes a plurality of pixels and displays an image through a front surface facing the cover window 120. For example, the display panel 110 can be an electroluminescent display panel including light emitting diodes or a liquid crystal display panel including liquid crystal capacitors, but is not limited thereto. First, as shown in FIG. 2A, the display panel 110 of the present disclosure can be an electroluminescent display panel.

The display panel 110 can include a substrate 150, a thin film transistor Tr disposed on the substrate 150, a light emitting diode D connected to the thin film transistor Tr, and an encapsulation film 190 covering the light emitting diode D. More particularly, a semiconductor layer 154 is formed on the substrate 150. The substrate 150 can be formed of glass or plastic and can have flexibility. For example, the substrate 150 can include polyimide.

A buffer layer (not shown) can be formed between the substrate 150 and the semiconductor layer 154. The buffer layer can be formed of an inorganic insulation material such as silicon oxide ($SiO_2$) and silicon nitride (SiNx).

The semiconductor layer 154 can be formed of an oxide semiconductor material or polycrystalline silicon. When the semiconductor layer 154 is formed of the oxide semiconductor material, a light-blocking pattern (not shown) can be formed under the semiconductor layer 154. The light-blocking pattern blocks light from being incident on the semiconductor layer 154 to thereby prevent the semiconductor layer 154 from being degraded by the light. Alternatively, the semiconductor layer 154 can be formed of polycrystalline silicon, and in this instance, impurities can be doped in both ends of the semiconductor layer 154.

A gate insulation layer 156 of an insulating material is formed on the semiconductor layer 154. The gate insulation layer 156 can be formed of an inorganic insulation material such as silicon oxide ($SiO_2$) and silicon nitride (SiNx).

A gate electrode 160 of a conductive material such as metal can be formed on the gate insulation layer 156 to correspond to a central portion of the semiconductor layer 154.

In FIG. 2A, the gate insulation layer 156 is formed over substantially all of the substrate 150. Alternatively, the gate insulation layer 156 can be patterned to have the same shape as the gate electrode 160. An interlayer insulation layer 162 of an insulating material is formed on the gate electrode 160. The interlayer insulation layer 162 can be formed over substantially all of the substrate 150. The interlayer insulation layer 162 can be formed of an inorganic insulation material such as silicon oxide ($SiO_2$) and silicon nitride (SiNx) or an organic insulation material such as benzocyclobutene and photo acryl.

The interlayer insulation layer 162 includes first and second contact holes 164 and 166 exposing top surfaces of both side portions of the semiconductor layer 154, respectively. The first and second contact holes 164 and 166 are spaced apart from the gate electrode 160. The gate electrode 160 can be disposed between the first and second contact holes 164 and 166.

The first and second contact holes 164 and 166 are also formed in the gate insulation layer 156. Alternatively, when the gate insulation layer 156 is patterned to have the same shape as the gate electrode 160, the first and second contact holes 164 and 166 are formed only in the interlayer insulation layer 162.

A source electrode 170 and a drain electrode 172 of a conductive material such as metal are formed on the interlayer insulation layer 162. The source and drain electrodes 170 and 172 are spaced apart from each other with respect to the gate electrode 160. The source and drain electrodes 170 and 172 contact both side portions of the semiconductor layer 154 through the first and second contact holes 164 and 166, respectively.

The semiconductor layer 154, the gate electrode 160, the source electrode 170 and the drain electrode 172 constitute the thin film transistor Tr. The thin film transistor Tr functions as a driving element.

The thin film transistor Tr can have a coplanar structure where the gate electrode 160 and the source and drain electrodes 170 and 172 are disposed over the semiconductor layer 154. Alternatively, the thin film transistor Tr can have an inverted staggered structure where the gate electrode is disposed under the semiconductor layer and the source and drain electrodes are disposed over the semiconductor layer. In this instance, the semiconductor layer can be formed of amorphous silicon.

Although not shown in the figure, a gate line and a data line cross each other to define a pixel region, and a switching element is connected to the gate line and the data line. The switching element is also connected to the thin film transistor Tr of the driving element. The switching element can have the same structure as the thin film transistor Tr.

In addition, a power line can be further formed in parallel to and spaced apart from the gate line or the data line, and a storage capacitor can be further formed to constantly maintain a voltage at the gate electrode of the thin film transistor Tr during one frame.

A passivation layer 174 is formed on the source and drain electrodes 170 and 172. The passivation layer 174 can be formed over substantially all of the substrate 150. The passivation layer 174 covers the thin film transistor Tr and has a drain contact hole 176 exposing the drain electrode 172. The passivation layer 174 can be formed of an inorganic insulation material such as silicon oxide ($SiO_2$) and silicon nitride (SiNx) or an organic insulation material such as benzocyclobutene and photo acryl. The passivation layer 174 can have a flat top surface.

In FIG. 2A, although the drain contact hole 176 is formed directly over the second contact hole 166, the drain contact hole 176 can be spaced apart from the second contact hole 166. A first electrode 180 is formed on the passivation layer 174 and is connected to the drain electrode 172 of the thin film transistor Tr through the drain contact hole 176. The first electrode 180 is separately disposed in each pixel region. The first electrode 180 can be an anode and can be formed of a conductive material having a relatively high work function. For example, the first electrode 180 can be formed of a transparent conductive material such as indium tin oxide (ITO) and indium zinc oxide (IZO).

In case display panel 110 of the present disclosure is a top emission type electroluminescent display panel where light emitted from a light emitting layer is outputted to the outside through a second electrode opposite to the first electrode 180, a reflection electrode or reflection layer can be further formed under the first electrode 180. For example, the reflection electrode or reflection layer can be formed of aluminum-palladium-copper (APC) alloy.

A bank layer 186 is formed on the first electrode 180 and the passivation layer 174. The bank layer 186 covers edges of the first electrode 180. The bank layer 186 exposes a central portion of the first electrode 180 corresponding to the pixel region.

A light emitting layer 182 is formed on the first electrode 180 exposed by the bank layer 186. The light emitting layer 182 can have a single layer structure of a light emitting material layer. Alternatively, to increase luminous efficiency, the light emitting layer 182 can have a multi layer structure and can include a hole injection layer, a hole transporting layer, a light emitting material layer, an electron transporting layer, and an electron injecting layer sequentially laminated on the first electrode 180. The light emitting material of the light emitting material layer can be an organic light emitting material or an inorganic light emitting material such as quantum dots.

A second electrode 184 is formed over the substrate 150 on which the light emitting layer 182 is formed. The second electrode 184 can be formed over substantially entire display area. The second electrode 184 can be formed of a conductive material having relatively low work function and can serve as a cathode. For example, the second electrode 184 can be formed of aluminum (Al), magnesium (Mg), or their alloy, but is not limited to this.

The first electrode 180, the light emitting layer 182 and the second electrode 184 constitute the light emitting diode D.

The encapsulation film 190 is formed on the second electrode 184 in order to prevent moisture from permeating the light emitting diode D. The encapsulation film 190 can include a first inorganic insulation layer 192, an organic insulation layer 194 and a second inorganic insulation layer 196, but is not limited thereto.

In addition, when the display panel 110 of the present disclosure is a top emission type electroluminescent display panel, a polarizer (not shown) can be attached to the encapsulation film 190 in order to reduce reflection of external light. For example, the polarizer can be a circular polarizer.

As shown in FIG. 2B, the display panel 110 of the present disclosure can be a liquid crystal display panel. The display panel 110 can include first and second substrates 210 and 250 facing each other and a liquid crystal layer 260 interposed between the first and second substrates 210 and 250. The liquid crystal layer 260 includes liquid crystal molecules 262. First and second polarizers 272 and 274 can be disposed on outer surfaces of the first and second substrates 210 and 250, respectively.

At least one of the first and second substrates 210 and 250 can be formed of glass or plastic and can have flexibility. For example, at least one of the first and second substrates 210 and 250 can include polyimide. In addition, a buffer layer (not shown) can be further formed on the first substrate 210 and/or the second substrate 250.

A gate electrode 222 is formed on an inner surface of the first substrate 210, and a gate insulation layer 224 is formed to cover the gate electrode 222. Also, a gate line (not shown) connected to the gate electrode 222 is formed on the first substrate 210.

A semiconductor layer 226 is formed on the gate insulation layer 224 to correspond to the gate electrode 222. The semiconductor layer 226 can be formed of an oxide semiconductor material. Alternatively, the semiconductor layer 226 can include an active layer of intrinsic amorphous silicon and ohmic contact layers of impurity-doped amorphous silicon.

Source and drain electrodes 230 and 232 are formed on the semiconductor layer 226 and are spaced apart from each other. In addition, a data line (not shown) connected to the source electrode 230 is formed on the gate insulation layer 224 and crosses the gate line to thereby define a pixel region.

The gate electrode 222, the semiconductor layer 226, the source electrode 230 and the drain electrode 232 constitute a thin film transistor Tr.

A passivation layer 234 is formed on the thin film transistor Tr. The passivation layer 234 has a drain contact hole 236 exposing the drain electrode 232.

A pixel electrode 240 and a common electrode 242 are formed on the passivation layer 234. Parts of the pixel electrode 240 and parts of the common electrode 242 alternate each other. The pixel electrode 240 is connected to the drain electrode 232 through the drain contact hole 236.

A black matrix 254 is formed on an inner surface of the second substrate 250. The black matrix 254 shields a non-display area such as the thin film transistor Tr, the gate line, and the data line. In addition, a color filter layer 256 is formed on the second substrate 250 to correspond to the pixel region. A buffer layer (not shown) can be further formed between the second substrate 250 and the color filter layer 256.

The first and second substrates 210 and 250 are attached to each other with the liquid crystal layer 260 interposed therebetween. The liquid crystal molecules 262 of the liquid crystal layer 260 are driven by an electric field generated between the pixel electrode 240 and the common electrode 242. The pixel electrode 240, the common electrode 242 and the liquid crystal layer 260 constitute a liquid crystal capacitor, and the liquid crystal capacitor is connected to the thin film transistor Tr.

Although not shown in the figure, an alignment layer can be formed on each of the first and second substrate 210 and 250 adjacent to the liquid crystal layer 260.

Further, the first and second polarizers 272 and 274, which transmit linearly polarized light along a predetermined direction, are attached on outer surfaces of the first and second substrates 210 and 250. A light transmission axis of the first polarizer 272 is arranged perpendicularly to a light transmission axis of the second polarizer 274.

The common electrode 242 is formed on the first substrate 210 and has the parts alternating the parts of the pixel electrode 240. Alternatively, the common electrode can be formed on a substantially entire surface of the second substrate 250, and the pixel electrode can be formed on the first substrate 210 to have a plate shape corresponding to the pixel region.

Referring back to FIG. 1, the cover window 120 is disposed on the display panel 110, i.e., on a front surface of the display panel 110. The cover window 120 can be formed of glass or plastic, but is not limited thereto.

At least one end of the cover window 120 is bent, and the cover window 120 has a curved shape. As shown in the figure, each of both ends of the cover window 120 can have a curved shape. The image of the display panel 110 is outputted through an outer surface of the cover window 120.

The cover window 120 of a curved shape has a plurality of concave patterns (not shown) at its inner surface, and this will be described in detail later. The adhesive layer 130 is disposed on the inner surface of the cover window 120 having the ends of the curved shape, that is, between the cover window 120 and the display panel 110. The adhesive layer 130 can be an optically clear adhesive (OCA) having of a film type or an optically clear resin (OCR) of a liquid type, but is not limited thereto.

The cover window 120 and the display panel 110 are attached to each other through the adhesive layer 130. Since the cover window 120 has the ends of the curved shape, ends of the display panel 110 are also bent to have a curved shape.

Accordingly, the display device according to the embodiment of the present disclosure has ends of a curved shape, and thus the display device of the present disclosure can have an increased display as compared with a flat display device having the same size or the ends of the display device of the present disclosure can be utilized as an auxiliary area for driving.

Hereinafter, the cover window of the present disclosure will be described in more detail with reference to drawings.

Figure 3:
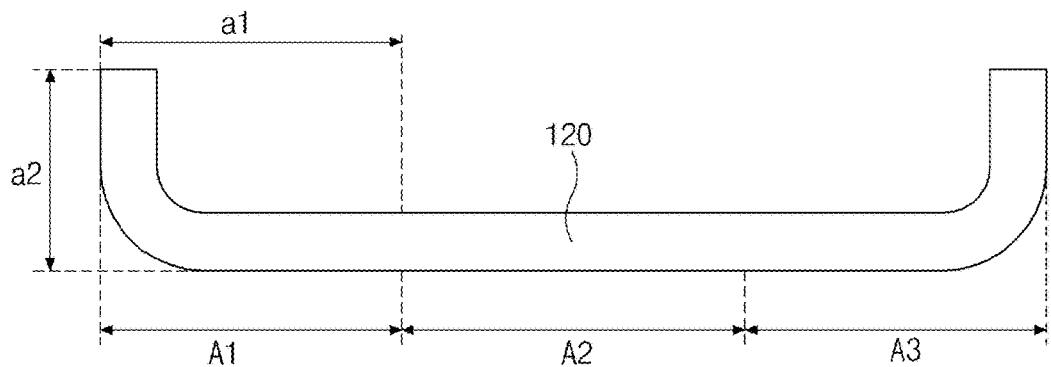
FIG. 3 is a cross-sectional view schematically showing a cover window according to the embodiment of the present disclosure.

FIG. 3 is a cross-sectional view schematically showing a cover window according to the embodiment of the present disclosure. In FIG. 3, the cover window 120 according to the embodiment of the present disclosure includes first, second and third areas A1, A2 and A3 sequentially disposed along a first direction. Each of the first, second and third areas A1, A2 and A3 has an outer surface and an inner surface at the opposite side of the outer surface. The second area A2 is disposed between the first and third areas A1 and A3, the first area A1 is connected to one end of the second area A2, and the third area A3 is connected to the other end of the second area A2. The first and third areas A1 and A3 are symmetric with respect to the second area A2.

The second area A2 has a flat shape, and the first and third areas A1 and A3 have a curved shape. That is, the first and third areas A1 and A3 each have at least one bending portion or curved portion. The first area A1 has a first length a1 along the first direction and a second length a2 along a second direction perpendicular to the first direction. The first length a1 beneficially is about 1.5 times the second length a2.

In addition, the third area A3, which is symmetrical with the first area A1, can have the same lengths as the first area A1 along the first direction and the second direction.

Since the cover window 120 has the plurality of concave patterns at its inner surface, it is possible to increase adhesion and to prevent the occurrence of bubbles by improving the wetting and bonding force due to the interlocking effect with the adhesive layer 130 of FIG. 1, and this will be described in detail with reference to FIGS. 4 and 5.

Figure 4:
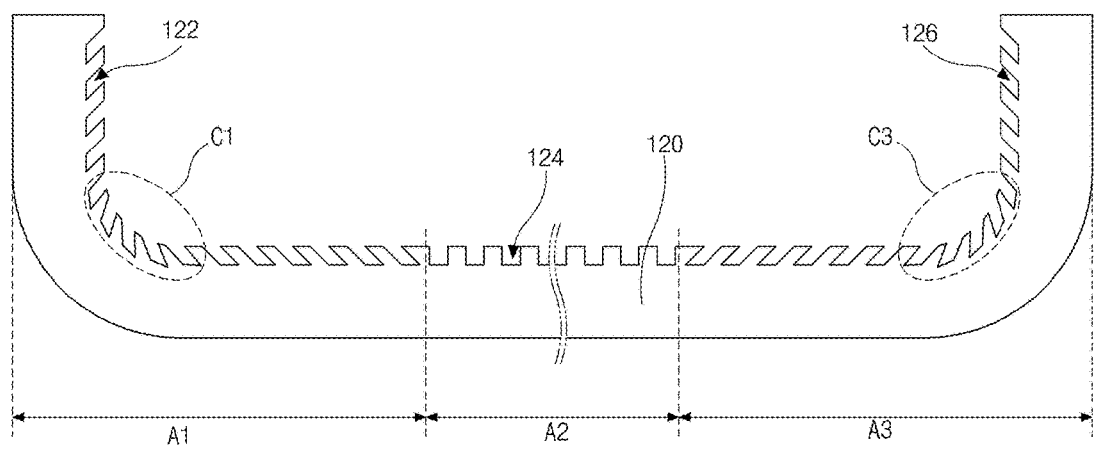
FIG. 4 is a cross-sectional view enlarging the cover window according to the embodiment of the present disclosure.
Figure 5:
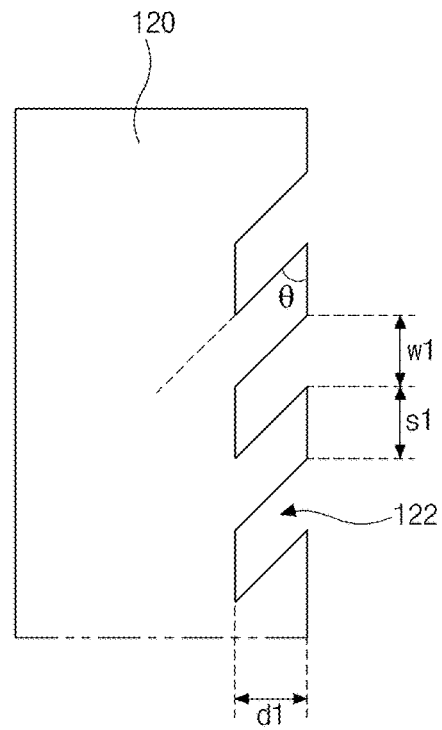
FIG. 5 is a cross-sectional view enlarging concave patterns in a first area of the cover window according to the embodiment of the present disclosure.

FIG. 4 is a cross-sectional view enlarging the cover window according to the embodiment of the present disclosure, and FIG. 5 is a cross-sectional view enlarging concave patterns in a first area of the cover window according to the embodiment of the present disclosure. In FIGS. 4 and 5, the first, second and third areas A1, A2 and A3 of the cover window 120 have first, second and third concave patterns 122, 124 and 126 at their inner surfaces, respectively.

More particularly, each of the first concave patterns 122 (also referred to as first concaved portions 122) can have at least one side inclined at a predetermined angle with respect to the inner surface of the first area A1. For example, when each first concave pattern 122 is rectangular, two sides of the first concave pattern 122 can be inclined at a first angle $\theta$ less than 90 degrees with respect to the inner surface of the first area A1. The first concave patterns 122 can be formed so as to extend downward from the inner surface of the first area A1 and/or in a direction toward the second area A2 when the cover window 120 is convexed downward as shown in the figure.

The adhesion of the adhesive layer 130 of FIG. 1 in a range of the first angle $\theta$ of the first concave patterns 122 is compared with the adhesion of the adhesive layer 130 of FIG. 1 without the first concave patterns.

In addition, when the first angle $\theta$ of the first concave patterns 122 is more than 40 degrees and less than 50 degrees, the transmittance is 90% or more, and this is similar to the transmittance when the first concave patterns are not formed. On the other hand, when the first angle $\theta$ is smaller than 40 degrees or larger than 50 degrees, the transmittance is less than 90%.

Therefore, the first angle $\theta$ of the first concave patterns 122 is beneficially 40 degrees to 50 degrees, and more beneficially, 45 degrees to 50 degrees.

These first concave patterns 122 can be formed at a uniform density with respect to the inner surface of the first area A1. Namely, the first concave patterns 122 can have a uniform width w1 and spacing s1 with respect to the inner surface of the first area A1. Each of the width w1 and the spacing s1 of the first concave patterns 122 is desirably 10 to 50 micrometers, and more desirably, 30 to 50 micrometers. In addition, a depth d1 of the first concave patterns 122 is beneficially 10 to 50 micrometers, and more beneficially, 30 to 50 micrometers.

If the width w1, the spacing s1, and the depth d1 are smaller than 10 micrometers, it is impossible to increase the bonding force between the cover window 120 and the adhesive layer 130 of FIG. 1. On the other hand, if the width w1, the spacing s1, and the depth d1 are larger than 50 micrometers, the first concave patterns 122 are visually recognized to lower the transmittance. The width w1 of the first concave patterns 122 can be the same as or larger than the spacing s1 of the first concave patterns 122.

Alternatively, the width w1 and/or the spacing s1 of the first concave patterns 122 can be varied depending on the position, and thus the first concave patterns 122 can have different densities depending on the position. That is, the inner surface of the first area A1 includes a curved portion C1 and a flat portion excluding the curved portion C1, and it is effective for increasing the bonding force between the cover window 120 and the adhesive layer 130 of FIG. 1 that the first concave patterns 122 at the curved portion C1 have a higher density than those at the flat portion.

The width w1 of the first concave patterns 122 can be the same at the curved portion C1 and the flat portion, and the spacing s1 between the first concave patterns 122 at the curved portion C1 can be smaller than that at the flat portion. Alternatively, the width and the spacing of the first concave patterns 122 at the curved portion C1 can be smaller than those of the flat portion.

Moreover, the third concave patterns 126 (also referred to as third concaved portions 126) can be symmetrical with the first concave patterns 122 with respect to the second area A2.

The third concave patterns 126 can have at least one side inclined at the first angle θ with respect to the inner surface of the third area A3, and the third concave patterns 126 can be formed so as to extend downward from the inner surface of the third area A3 and/or in a direction toward the second area A2. These third concave patterns 126 can be formed at a uniform density with respect to the inner surface of the third area A3. Alternatively, the third concave patterns 126 can have different densities depending on the position. That is, the inner surface of the third area A3 includes a curved portion C3 and a flat portion excluding the curved portion C3, and the third concave patterns 126 at the curved portion C3 can have a higher density than those at the flat portion.

The second concave patterns 124 (also referred to as second concaved portions 124) can have at least one side substantially perpendicular to the inner surface of the second area A2. Namely, the at least one side of the second concave patterns 124 can have a second angle larger than the first angle θ with respect to the inner surface of the second area A2. These second concave patterns 124 can be formed at a uniform density with respect to the inner surface of the second area A2. Alternatively, the second concave patterns 124 can be formed at different densities depending on the position.

The second concave patterns 124 can have the same shape as the first concave patterns 122, the third concave patterns 126, or the first and third concave patterns 122 and 126. The second concave patterns 124 can be omitted.

As described above, the cover window 120 according to the embodiment of the present disclosure includes the curved first and third areas A1 and A3 with the plurality of concave patterns 122 and 126 at the inner surface thereof, and a part of the adhesive layer 130 of FIG. 1 is disposed in at least one of the concave patterns 122 and 126. Therefore, the wetting and bonding force are improved due to the interlocking effect between the concave patterns 122 and 126 of the cover window 120 and the adhesive layer 130 of FIG. 1, thereby increasing the adhesion and preventing the occurrence of the bubbles. The concave patterns 122 and 126 can be partially or completely filled with the adhesive layer 130 of FIG. 1.

In the embodiment of the present disclosure, the cover window 120 includes the first, second and third areas A1, A2 and A3. However, the third area A3 can be omitted.

Figure 6A:
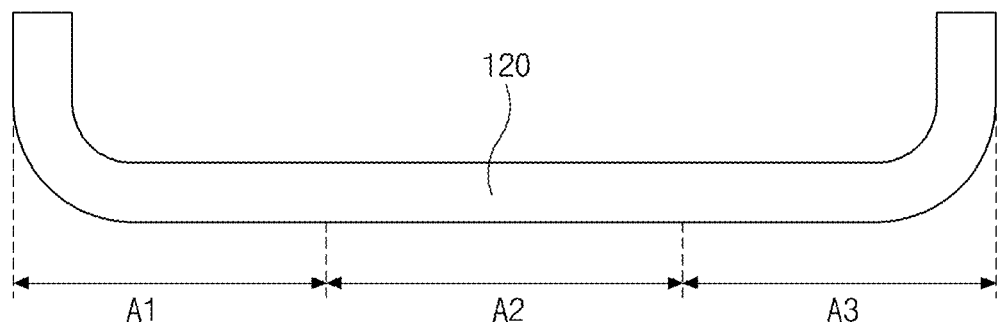
FIGS. 6A to 6C are cross-sectional views schematically showing a display device in respective steps for manufacturing the display device according to the embodiment of the present disclosure.
Figure 6B:
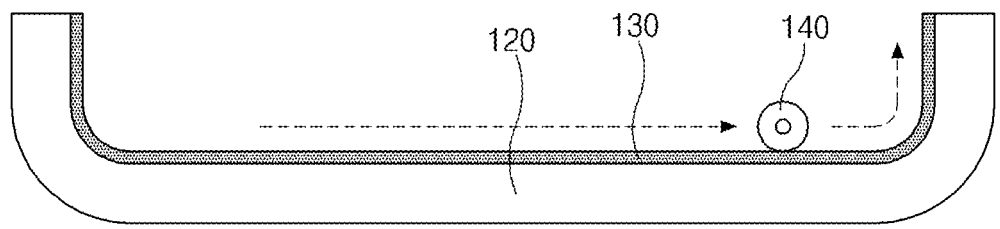
Figure 6C:
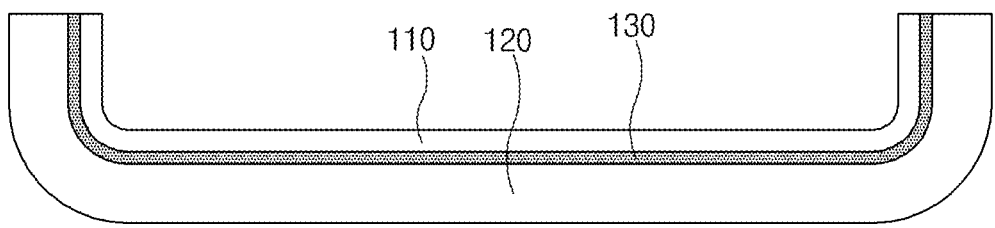

FIGS. 6A to 6C are cross-sectional views schematically showing a display device in respective steps for manufacturing the display device according to the embodiment of the present disclosure.

In FIG. 6A, the cover window 120 including first, second and third areas A1, A2 and A3 sequentially disposed is provided. Here, the first and third areas A1 and A3 have a curved shape, and the second area A2 has a flat shape. In addition, the first, second and third areas A1, A2 and A3 include first, second and third concave patterns 122, 124 and 126 of FIG. 4, respectively, at the inner surfaces thereof. Here, the second concave patterns 124 of FIG. 4 can be omitted.

Next, in FIG. 6B, the adhesive layer 130 is formed on the inner surface of the cover window 120. For example, the adhesive layer 130 can be formed of an optically clear adhesive (OCA) having of a film type, and in this case, the adhesive layer 130 can be formed by laminating the OCA film on the inner surface of the cover window 120 using a roller 140.

Alternatively, the adhesive layer 130 can be formed of an optically clear resin (OCR) of a liquid type, and in this case, the adhesive layer 130 can be formed by coating the OCR on the inner surface of the cover window 120.

In FIG. 6C, the display panel 110 is disposed on the adhesive layer 130, and the display panel 110 and the cover window 120 are adhered to each other through the adhesive layer 130 by applying UV or heat and hardening the adhesive layer 130 to prepare the display device with curved shaped ends. In the display device of the present disclosure, since the cover window 120, more specifically, at least the first and third areas A1 and A3 of FIG. 4 of the curved shape have the plurality of concave patterns 122 and 126 of FIG. 4, the wetting and bonding force are improved due to the interlocking effect between the concave patterns 122 and 126 of the cover window 120 and the adhesive layer 130, thereby increasing the adhesion and preventing the occurrence of the bubbles.

Figure 7A:
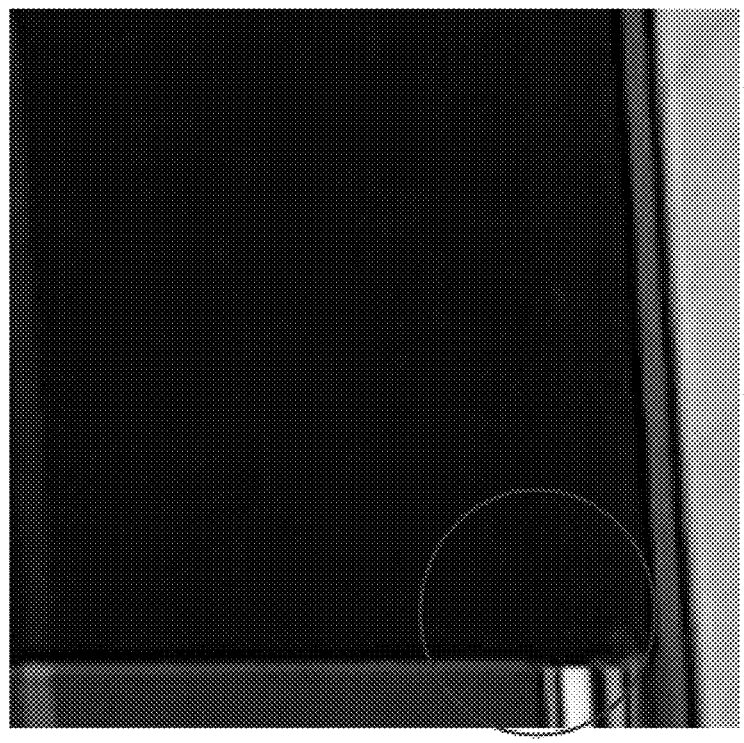
FIG. 7A is a photograph showing a display device including a cover window according to the embodiment of the present disclosure.
Figure 7B:
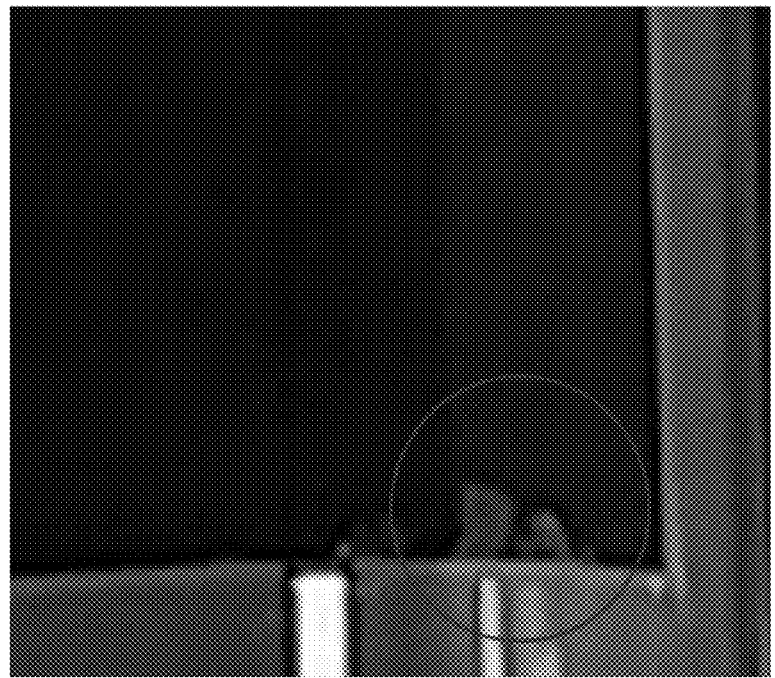
FIG. 7B is a photograph showing a display device including a cover window according to a comparative example.

FIG. 7A is a photograph showing a display device including a cover window according to the embodiment of the present disclosure, and FIG. 7B is a photograph showing a display device including a cover window according to a comparative example. The cover window according to the comparative example has a curved shape and does not include concave patterns on the inner surface thereof.

As shown in FIG. 7A, in the display device according to the embodiment of the present disclosure, since the cover window 120 of FIG. 4 includes the concave patterns 122 and 126 of FIG. 4 on the inner surfaces of the first and third areas A1 and A3 of FIG. 4 having the curved shape, the bubbles are prevented from occurring between the cover window 120 of FIG. 4 and the adhesive layer 130 of FIG. 1, and exhibited no spots.

On the other hand, as shown in FIG. 7B, in the display device according to the comparative example, since the cover window does not include the concave patterns, the bubbles occur between the cover window and the adhesive layer, and there are spots, thereby lowering the display quality.

Figure 8A:
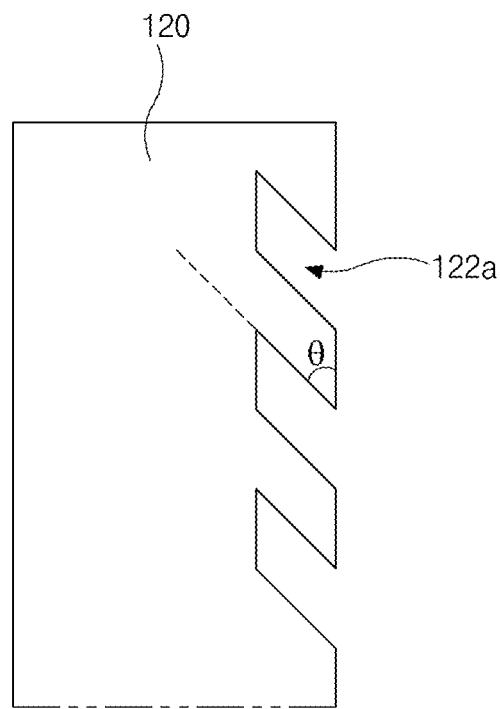
FIGS. 8A to 8C are views schematically showing the concave patterns of the cover window according to the embodiment of the present disclosure.
Figure 8B:
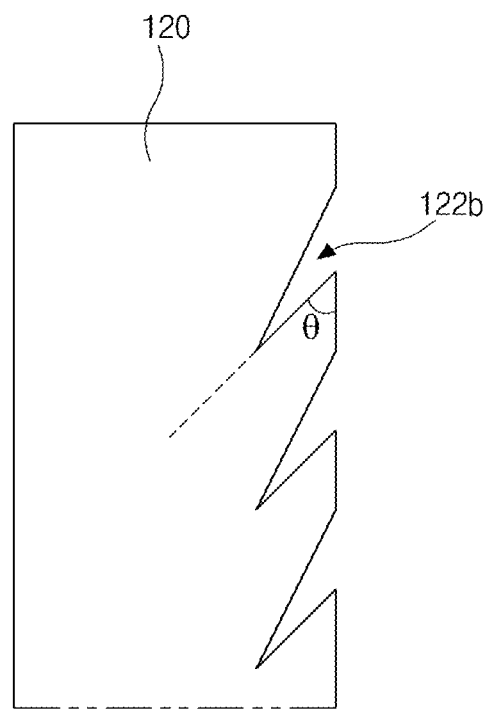
Figure 8C:
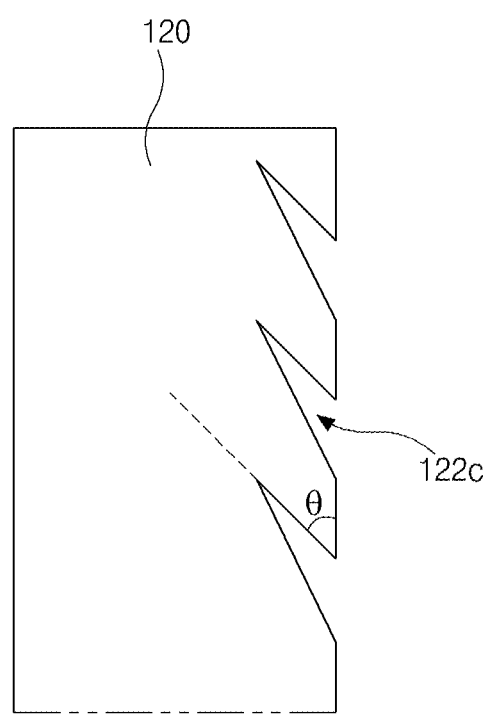

The concave patterns of the cover window can have various shapes. FIGS. 8A to 8C are schematic views showing the concave patterns of the cover window according to the embodiment of the present disclosure, and the concave patterns of FIGS. 8A to 8C are the first concave patterns of the first area.

In FIG. 8A, the first concave patterns 122a can have a rectangular shape, and both sides of each first concave pattern 122a can be inclined at the first angle θ smaller than 90 degrees with respect to the inner surface of the first area A1 of FIG. 4. As shown in FIG. 4, when the cover window 120 is disposed to be convex downward, the first concave patterns 122a can be formed to extend upward from the inner surface of the first area A1 of FIG. 4 and/or in a direction opposite to the second area A2 of FIG. 4. Each first concave pattern 122a can have four sides corresponding to a rectangle, which have the same length. Alternatively, the adjacent sides of each first concave pattern 122a can have different lengths from each other.

Alternatively, in FIG. 8B and FIG. 8C, the first concave patterns 122b and 122c can have a triangular shape. In each first concave pattern 122b and 122c, a shorter side of adjacent two sides can be inclined at the first angle θ smaller than 90 degrees with respect to the inner surface of the first area A1 of FIG. 4.

When the cover window 120 is disposed to be convexed downward as shown in FIG. 4, in FIG. 8B, the first concave patterns 122b can be formed to extend downward from the inner surface of the first area A1 of FIG. 4 and/or in a direction toward the second area A2 of FIG. 4. Alternatively, in FIG. 8C, the first concave patterns 122c can be formed to extend upward from the inner surface of the first area A1 of FIG. 4 and/or in a direction opposite to the second area A2 of FIG. 4.

In the present disclosure, since the display device has the ends of the curved shape, the display device of the present disclosure can have an increased display as compared with a flat display device having the same size or the ends of the display device of the present disclosure can be utilized as an auxiliary area for driving.

In addition, the display device includes a curved cover window, and the curved cover window has the concave patterns at the inner surface, thereby improving adhesion to the adhesive layer and preventing delamination. Therefore, it is possible to prevent the occurrence of bubbles and to prevent the deterioration of display quality.

It will be apparent to those skilled in the art that various modifications and variations can be made in a device of the present disclosure without departing from the sprit or scope of the embodiment. Thus, it is intended that the present disclosure covers the modifications and variations of this invention provided they come within the scope of the appended claims and their equivalents.

What is claimed is:

1. A cover window of a display device, comprising:
   a first area of a curved shape; and
   a second area of a flat shape and having a first end connected to the first area,
   wherein the first area has a plurality of first concave patterns and a convex pattern between adjacent first concave patterns at an inner surface of the first area on which adhesive is applied for attaching to a display panel,
   wherein the inner surface of the first area continuously extends along the adjacent first concave patterns and the convex pattern, and
   wherein the second area has a plurality of second concave patterns and a convex pattern between adjacent second concave patterns at an inner surface of the second area on which adhesive is applied for attaching to the display panel.

2. The cover window of claim 1, wherein at least one side of each of the first concave patterns is inclined at a first angle with respect to the inner surface of the first area facing the display panel.

3. The cover window of claim 1, wherein a width of each first concave pattern is a same as or larger than a spacing between adjacent ones of the first concave patterns.

4. The cover window of claim 1, wherein the inner surface of the first area includes a curved portion and a flat portion, and the plurality of first concave patterns at the curved portion are of a higher density than the plurality of first concave patterns at the flat portion.

5. The cover window of claim 1, wherein at least one side of each of the second concave patterns has a second angle with respect to the inner surface of the second area, and the second angle is larger than the first angle.

6. The cover window of claim 1, further comprising a third area connected to a second end of the second area, wherein the third area has a plurality of third concave patterns at an inner surface of the third area facing the display panel.

7. The cover window of claim 6, wherein the first concave patterns and the third concave patterns are symmetrical with respect to the second area.

8. The cover window of claim 1, wherein the cover window consists of a single body.

9. A display device, comprising:
   a cover window including a first area of a curved shape and a second area of a flat shape and having a first end connected to the first area, wherein the first area has a plurality of first concave patterns and a convex pattern between adjacent first concave patterns at an inner surface of the first area, wherein the inner surface of the first area continuously extends along the adjacent first concave patterns and the convex pattern, and wherein the second area has a plurality of second concave patterns and a convex pattern between adjacent second concave patterns at an inner surface of the second area;
   a display panel under the cover window, the inner surface of the first area facing the display panel; and
   an adhesive layer between the cover window and the display panel.

10. The display device of claim 9, wherein at least one side of each of the first concave patterns is inclined at a first angle with respect to the inner surface of the first area facing the display panel.

11. The display device of claim 9, wherein a width of each first concave pattern is a same as or larger than a spacing between adjacent ones of the first concave patterns.

12. The display device of claim 9, wherein the inner surface of the first area includes a curved portion and a flat portion, and the plurality of first concave patterns at the curved portion are of a higher density than the plurality of first concave patterns at the flat portion.

13. The display device of claim 9, wherein the cover window further comprises a third area connected to a second end of the second area, and the third area has a plurality of third concave patterns at an inner surface of the third area facing the display panel.

14. A cover window, comprising:
   an outer surface; and
   an inner surface at an opposite side of the outer surface, at least part of the inner surface curved to match a shape of an outer surface of a display panel, each of a curved part and a flat part of the inner surface patterned with a plurality of concaved portions and a convexed portion between adjacent concaved portions, at least a subset of which has slanted side surfaces to interlock with adhesive placed on the inner surface for attaching the cover window to a display panel,
   wherein the inner surface continuously extends along the adjacent concaved portions and the convexed portion.

15. The cover window of claim 14, wherein a width of each of the concaved portions is same as or larger than spacing between an adjacent concaved portion.

16. The cover window of claim 15, wherein the width of each of the concaved portions is 30 to 50 micrometers and a depth of each of the concaved portions is 30 to 50 micrometers.

17. The cover window of claim 14, wherein side surfaces of two adjacent ones of the concaved portions define space having a cross section of a rectangular shape.

18. The cover window of claim 14, wherein side surfaces of two adjacent ones of the concaved portions define space having a cross section of a triangular shape.

19. The cover window of claim 14, wherein a curved portion of the inner surface having a higher density of the concaved portions relative to a flat portion of the inner surface.

20. The cover window of claim 14, wherein the cover window consists of a single body.

21. A display device, comprising:
a display panel including circuit for displaying images;
a cover window comprising an inner surface at least part of the inner surface curved to match a shape of an outer surface of the display panel, each of a curved part and a flat part of the inner surface patterned with a plurality of concaved portions and a convexed portion between adjacent concaved portions, at least a subset of the inner surface having slanted side surfaces, wherein the inner surface continuously extends along the adjacent concaved portions and the convexed portion; and
adhesive between the cover window and the display panel, at least part of the adhesive interlocking with the slanted side surfaces to securely attach the cover window to the display panel.

* * * * *